United States Patent
Guan

(10) Patent No.: US 7,554,377 B1
(45) Date of Patent: Jun. 30, 2009

(54) APPARATUS AND METHOD FOR SIGNAL VOLTAGE LIMITING

(75) Inventor: Charles Yong Yi Guan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 84 days.

(21) Appl. No.: 11/856,242

(22) Filed: Sep. 17, 2007

(51) Int. Cl.
*H03K 3/17* (2006.01)

(52) U.S. Cl. ..................................... 327/321; 327/309

(58) Field of Classification Search ................. 327/309, 327/312, 317–321, 50
See application file for complete search history.

(56) References Cited

U.S. PATENT DOCUMENTS 4,918,399 A * 4/1990 Devecchi et al. ............ 330/253
7,368,991 B2 * 5/2008 Swanson ..................... 330/261

OTHER PUBLICATIONS

Burr-Brown Products from Texas Instruments, "Unity-Gain Stable, Wideband Voltage Limiting Amplifier", OPA698, Nov. 2002—revised Mar. 2006, 31 pages.
Intersil, "Output Clamping, 850 MHz Current Feedback Amplifier", HFA1130/883, Jul. 1994, pp. 204-222.

* cited by examiner

*Primary Examiner*—Dinh T. Le
(74) *Attorney, Agent, or Firm*—Vedder Price P.C.

(57) ABSTRACT

A circuit and method for limiting a signal voltage in which the minimum and maximum levels of the output signal can be controlled by selectively applying different lower and higher reference voltages from which the minimum and maximum output signal levels are derived.

20 Claims, 6 Drawing Sheets

APPARATUS AND METHOD FOR SIGNAL VOLTAGE LIMITING

BACKGROUND

1. Field of the Invention

The present invention relates to signal limiters, and in particular, to signal voltage limiters in which the output signal voltage peaks can be selectively limited to different voltages.

2. Related Art

Signal limiters are often used to limit signal voltages in a system to avoid undesired effects from nonlinear circuit operations, such as amplifier saturation and creation of signal harmonics and intermodulation signals. Such signal voltage limiters typically use diode clamps which clamp the intended signal to one or more fixed circuit voltages from which the clamped signal voltage differs by the voltage drops of the clamping diodes. However, strict reliance on the clamping diodes limits the accuracy of such voltage clamping with typical clamping errors of tens of millivolts.

SUMMARY

In accordance with the presently claimed invention, a circuit and method for limiting a signal voltage is provided in which the minimum and maximum levels of the output signal can be controlled by selectively applying different lower and higher reference voltages from which the minimum and maximum output signal levels are derived.

In accordance with one embodiment of the presently claimed invention, a voltage limiter includes:

at least one input electrode to convey an input signal having a magnitude;

a plurality of reference electrodes to convey lower and higher reference voltages;

an output electrode to convey an output voltage signal having a magnitude with minimum and maximum values corresponding to lower and higher clamp voltages, respectively;

amplifier circuitry coupled to the at least one input electrode and including one or more signal electrodes, and responsive to the input signal and the lower and higher clamp voltages by providing, via the one or more signal electrodes, one or more voltage signals having respective magnitudes corresponding to the input signal magnitude;

signal clamp circuitry coupled to the plurality of reference electrodes and the one or more signal electrodes, and responsive to the lower and higher reference voltages by providing the lower and higher clamp voltages; and comparator circuitry coupled to the plurality of reference electrodes, the signal clamp circuitry, the one or more signal electrodes and the output electrode, and responsive to the lower and higher reference voltages, the lower and higher clamp voltages, and the one or more voltage signals by providing the output voltage signal, wherein the output voltage signal magnitude corresponds to the one or more voltage signal magnitudes when at least one of the one or more voltage signal magnitudes is greater than the lower reference voltage and less than the higher reference voltage, corresponds to the lower reference voltage when at least one of the one or more voltage signal magnitudes is less than the lower reference voltage, and corresponds to the higher reference voltage when at least one of the one or more voltage signal magnitudes is greater than the higher reference voltage.

In accordance with another embodiment of the presently claimed invention, a voltage limiter includes:

amplifier means for receiving an input signal having a magnitude, and lower and higher clamp voltages and in response thereto providing one or more voltage signals having respective magnitudes corresponding to the input signal magnitude;

signal clamping means for receiving lower and higher reference voltages and in response thereto providing the lower and higher clamp voltages; and comparator means for receiving the lower and higher reference voltages, the lower and higher clamp voltages, and the one or more voltage signals and in response thereto providing the output voltage signal, wherein the output voltage signal magnitude has a magnitude with minimum and maximum values corresponding to lower and higher clamp voltages, respectively, corresponds to the one or more voltage signal magnitudes when at least one of the one or more voltage signal magnitudes is greater than the lower reference voltage and less than the higher reference voltage, corresponds to the lower reference voltage when at least one of the one or more voltage signal magnitudes is less than the lower reference voltage, and corresponds to the higher reference voltage when at least one of the one or more voltage signal magnitudes is greater than the higher reference voltage.

In accordance with another embodiment of the presently claimed invention, a method for limiting a signal voltage includes:

receiving an input signal having a magnitude, and lower and higher clamp voltages and in response thereto providing one or more voltage signals having respective magnitudes corresponding to the input signal magnitude;

receiving lower and higher reference voltages and in response thereto providing the lower and higher clamp voltages; and comparing the lower and higher reference voltages, the lower and higher clamp voltages, and the one or more voltage signals and in response thereto providing the output voltage signal, wherein the output voltage signal magnitude has a magnitude with minimum and maximum values corresponding to lower and higher clamp voltages, respectively, corresponds to the one or more voltage signal magnitudes when at least one of the one or more voltage signal magnitudes is greater than the lower reference voltage and less than the higher reference voltage, corresponds to the lower reference voltage when at least one of the one or more voltage signal magnitudes is less than the lower reference voltage, and corresponds to the higher reference voltage when at least one of the one or more voltage signal magnitudes is greater than the higher reference voltage.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
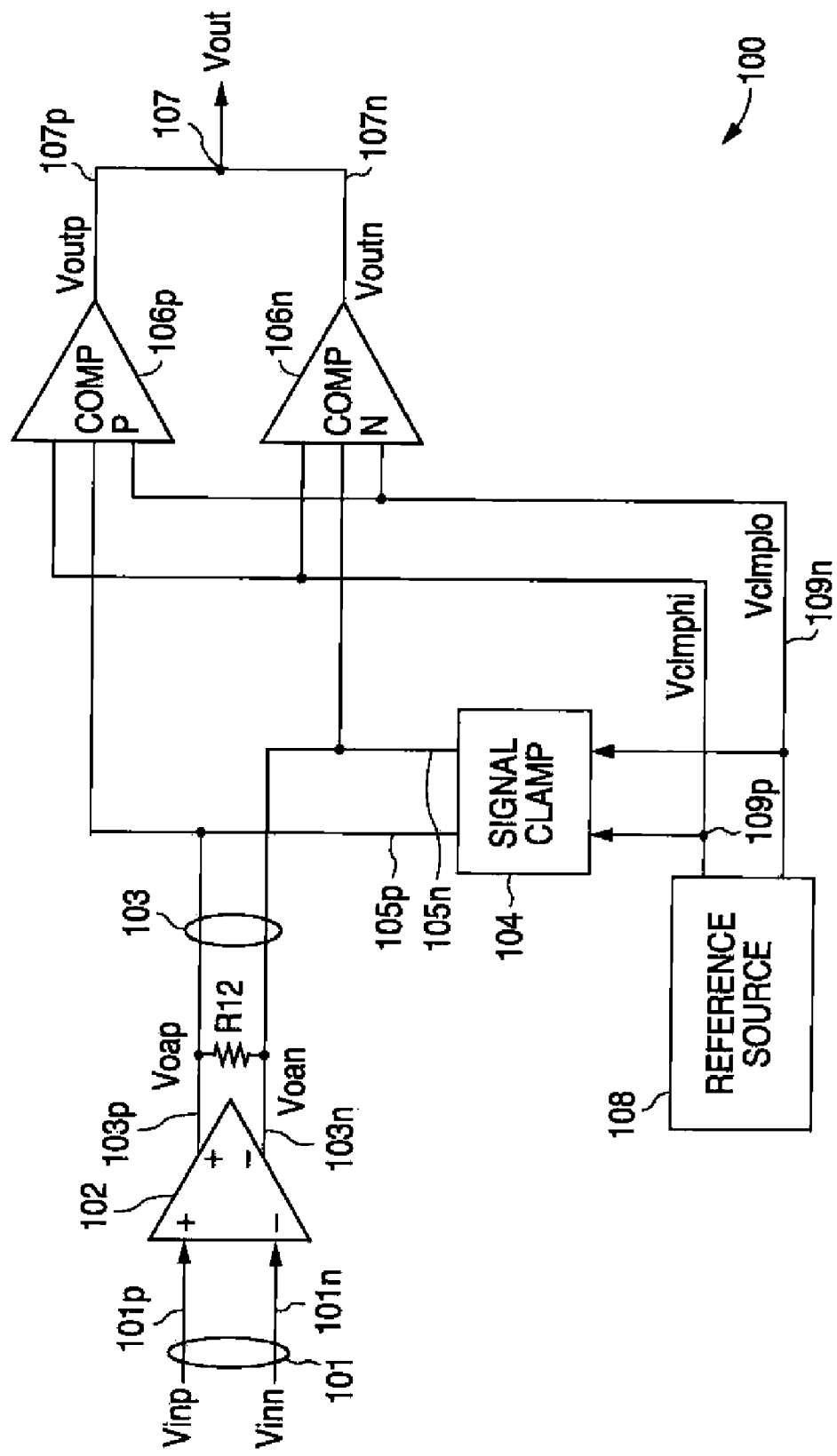
FIG. 1 is a function block diagram of a signal voltage limiter in accordance with one embodiment of the presently claimed invention.

Referring to FIG. 1, a signal voltage limiter 100 in accordance with one embodiment of the presently claimed invention includes a input amplifier 102 (e.g., differential), signal clamp circuitry 104, voltage comparator circuits 106p, 106n, and a reference voltage source 108, all interconnected substantially as shown. An analog input signal 101, e.g., in the form of a differential signal having positive 101p and negative 101n signal phases in accordance with a preferred embodiment, is amplified by the input amplifier circuit 102 to provide a single-ended output signal 103 having in-phase positive 103p and negative 103n signal components with instantaneous voltage magnitudes Voap and Voan, respectively, across a bias resistor R12 for the output stage (discussed in more detail below). These voltage magnitudes Voap, Voan include their respective differential voltage signal components 103p, 103n, plus respective DC clamp voltage components, 105p, 105n provided by the signal clamp circuit 104 (discussed in more detail below). (As is readily understood by one of ordinary skill in the art, these signal voltages Voap, Voan each include two components: the positive 103p or negative 103n signal component and positive 105p or negative 105n clamp component, which sum together via superposition.)

The reference voltage source 108 provides two reference voltages 109p, 109n having higher Vclmphi and lower Vclmplo reference voltage values, which are provided to the signal clamp circuit 104 and comparator circuits 106p, 106n. As discussed in more detail below, the signal clamp circuit 104 uses these reference voltages 109p, 109n to provide the DC clamp voltages 105p, 105n to the output electrodes of the input amplifier 102. As also discussed in more detail below, the comparator circuits 106p, 106n compare the amplified input signal voltages Voap, Voan to the reference voltages Vclmphi, Vclmplo to determine and provide their respective output voltage components Voutp, Voutn during substantially mutually exclusive time intervals as the output signal voltage Vout.

Figure 2A:
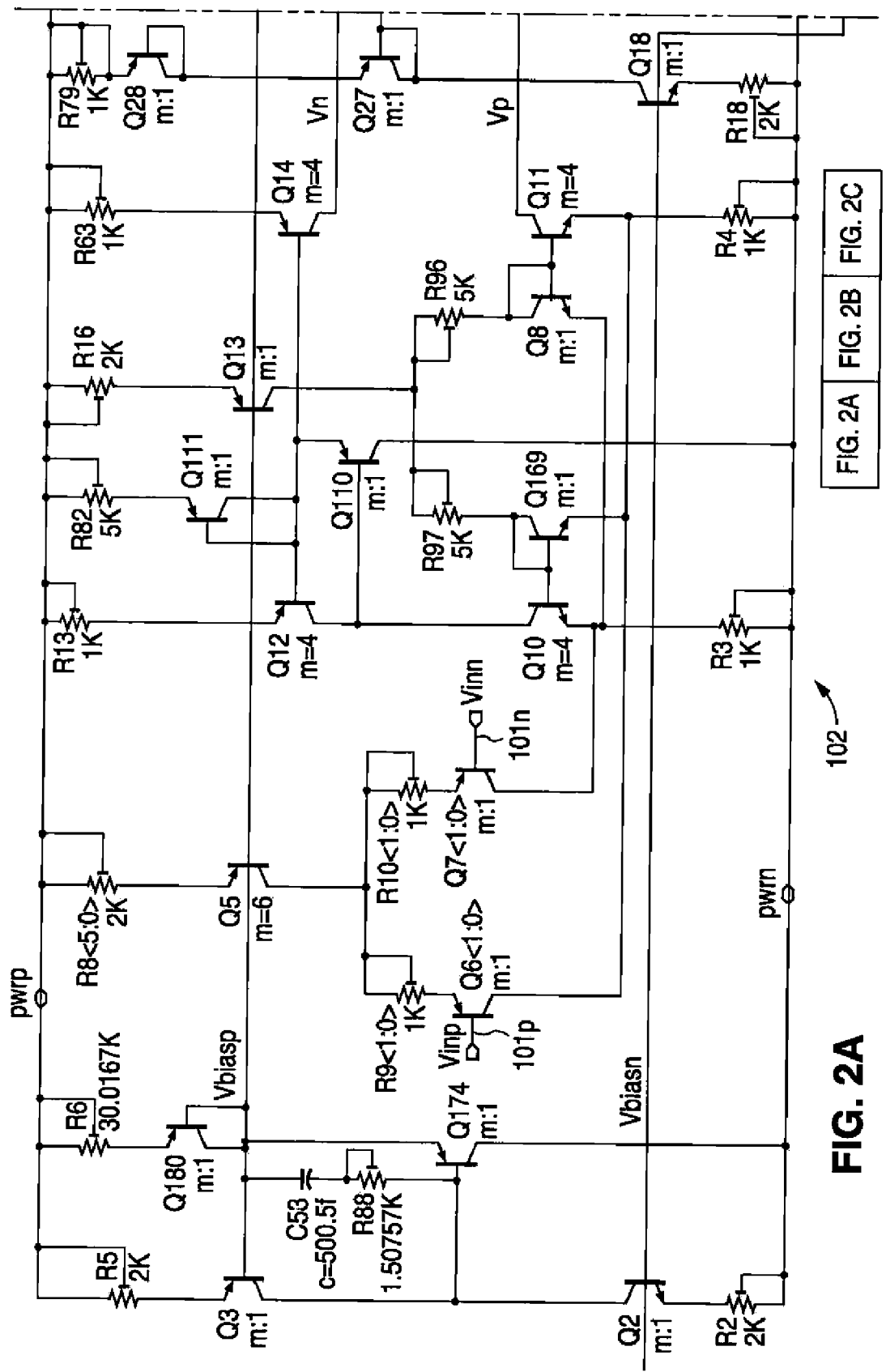
FIGS. 2A, 2B and 2C are a schematic diagram of the amplifier, signal clamp and reference source circuits of FIG. 1.
Figure 2B:
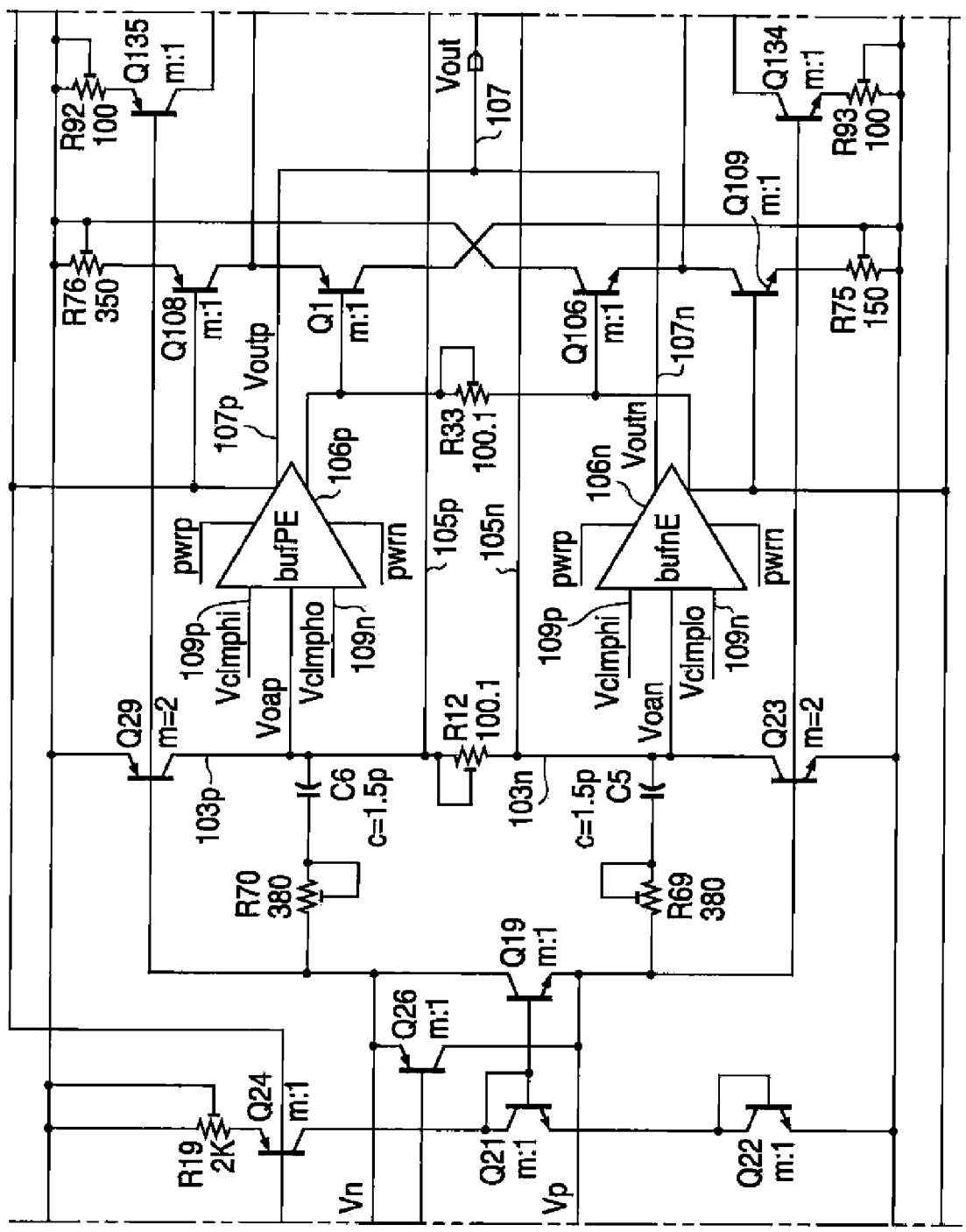
Figure 2C:
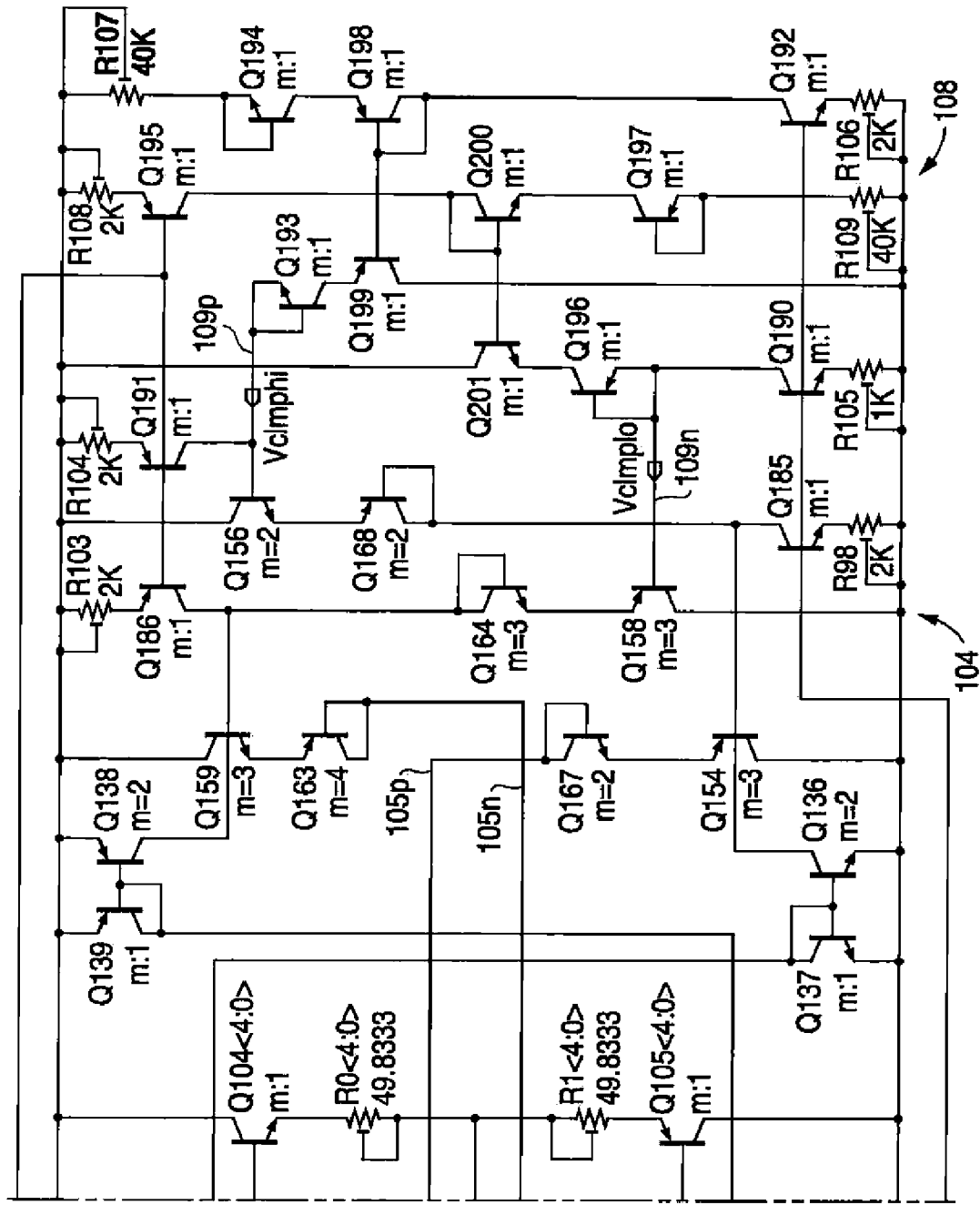

Referring to FIGS. 2A, 2B and 2C together, operation of the circuit 100 of FIG. 1 can be better understood. The positive 101p and negative 101n phases of the input signal 101 are amplified by input transistors Q6 and Q7, and further buffered by cascode transistors Q11 and Q10, with transistors Q12 and Q14 further providing differential to single-ended signal conversion for the negative phase 101n, to produce related voltage signals Vp and Vn. These voltage signals Vp, Vn are buffered further by transistors Q29 and Q23 to produce the in-phase positive 103p and negative 103n phases of the amplified input signal 103. As discussed above, these signal phases 103p, 103n are combined via superposition with the clamp voltages 105p, 105n to produce the signal voltages Voap, Voan for comparison by the voltage comparators 106p, 106n.

As noted above, the output signal Vout is a single ended signal. The input signals Voap, Voan to the voltage comparators 106p, 106n are very close in magnitudes, e.g., within one or two millivolts. Accordingly, the current flow through and, therefore, the voltage drop across resister R12 are small. When these voltage signals Voap, Voan have magnitudes such that the upper voltage Voap is less than the upper reference voltage Vclmphi and the lower voltage Voan is greater than the lower reference voltage Vclmplo, these amplified signal voltages Voap, Voan are buffered by the comparators 106p, 106n (discussed in more detail below) to provide the output voltage Vout.

When the upper signal voltage Voap is greater than the upper reference voltage Vclmphi, transistors Q156, Q168, Q154 and Q167 of the clamp circuitry 104 limit this voltage Voap to a value slightly greater (e.g., by approximately one millivolt) than the higher reference voltage Vclmphi. Similarly, when the lower signal voltage Voan is less than the lower reference voltage Vclmplo, transistors Q158, Q164, Q159 and Q163 limit this voltage Voan to a value slightly less (e.g., by approximately one millivolt) than the lower reference voltage Vclmplo.

Figure 3:
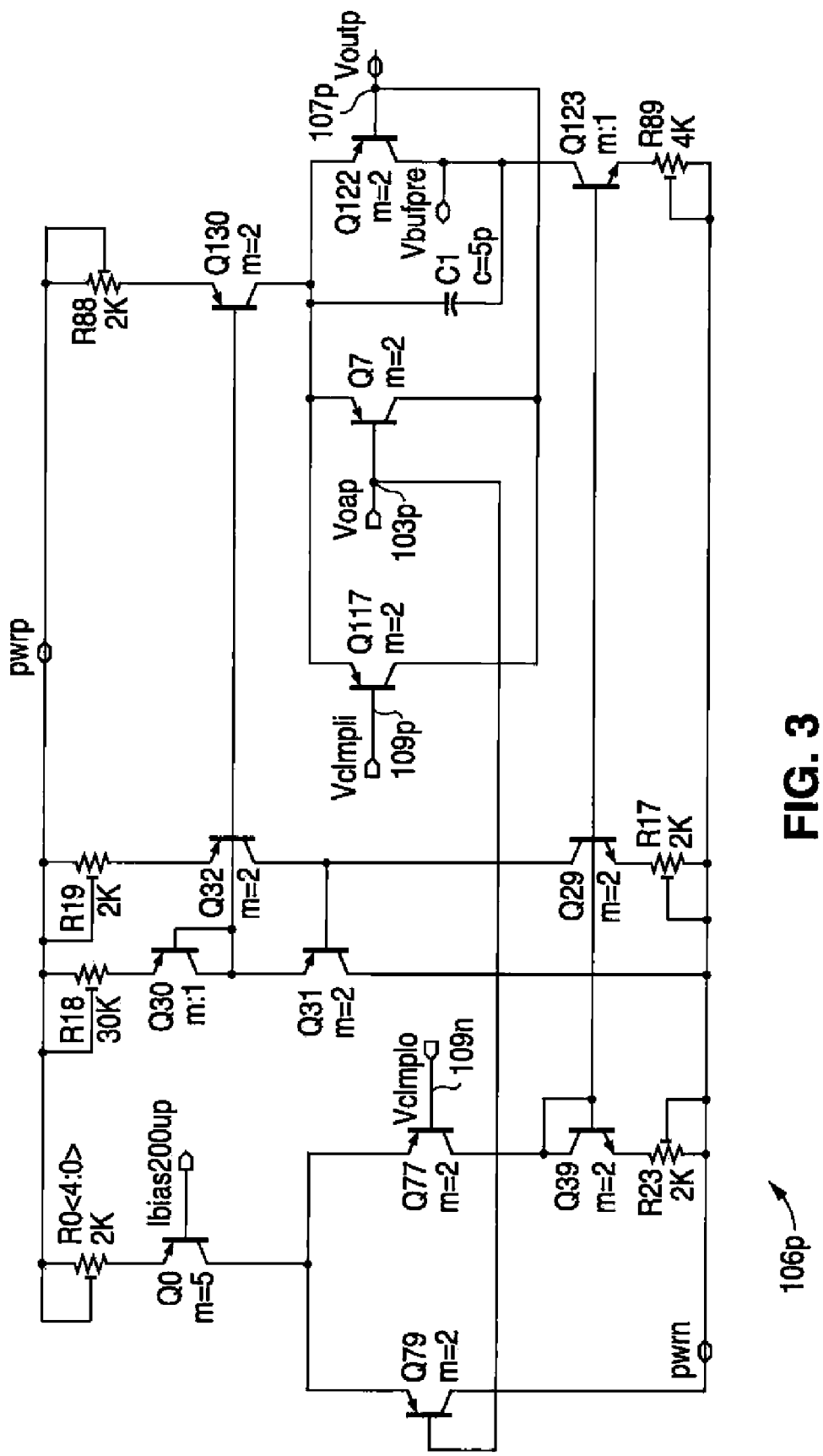
FIGS. 3 and 4 are schematic diagrams of the comparator circuits of FIG. 1.

Referring to FIG. 3, operation of the upper voltage comparator 106p is as follows. If the upper amplifier output voltage Voap is higher than the higher reference voltage Vclmphi, transistor Q7 is turned off and the higher reference voltage Vclmphi is buffered to provide the output voltage Voutp via transistors Q117 and Q122. Similarly, for the lower voltage comparator 106n, when the lower amplified voltage Voan is less than the lower reference voltage Vclmplo, transistor Q6 (FIG. 4) is turned off and the lower reference voltage Vclmplo is buffered to provide the output voltage Voutn via transistors Q121 and Q120. In both instances, the accuracy of the output voltages Voutp, Voutn, i.e., how close in value these voltages Voutp and Voutn are to the upper Vclmphi and lower Vclmplo reference voltages, respectively, are limited primarily by the voltage offsets within the upper 106p and lower 106n voltage comparators. Such offsets can be expected to be only single millivolts in magnitude.

Figure 4:
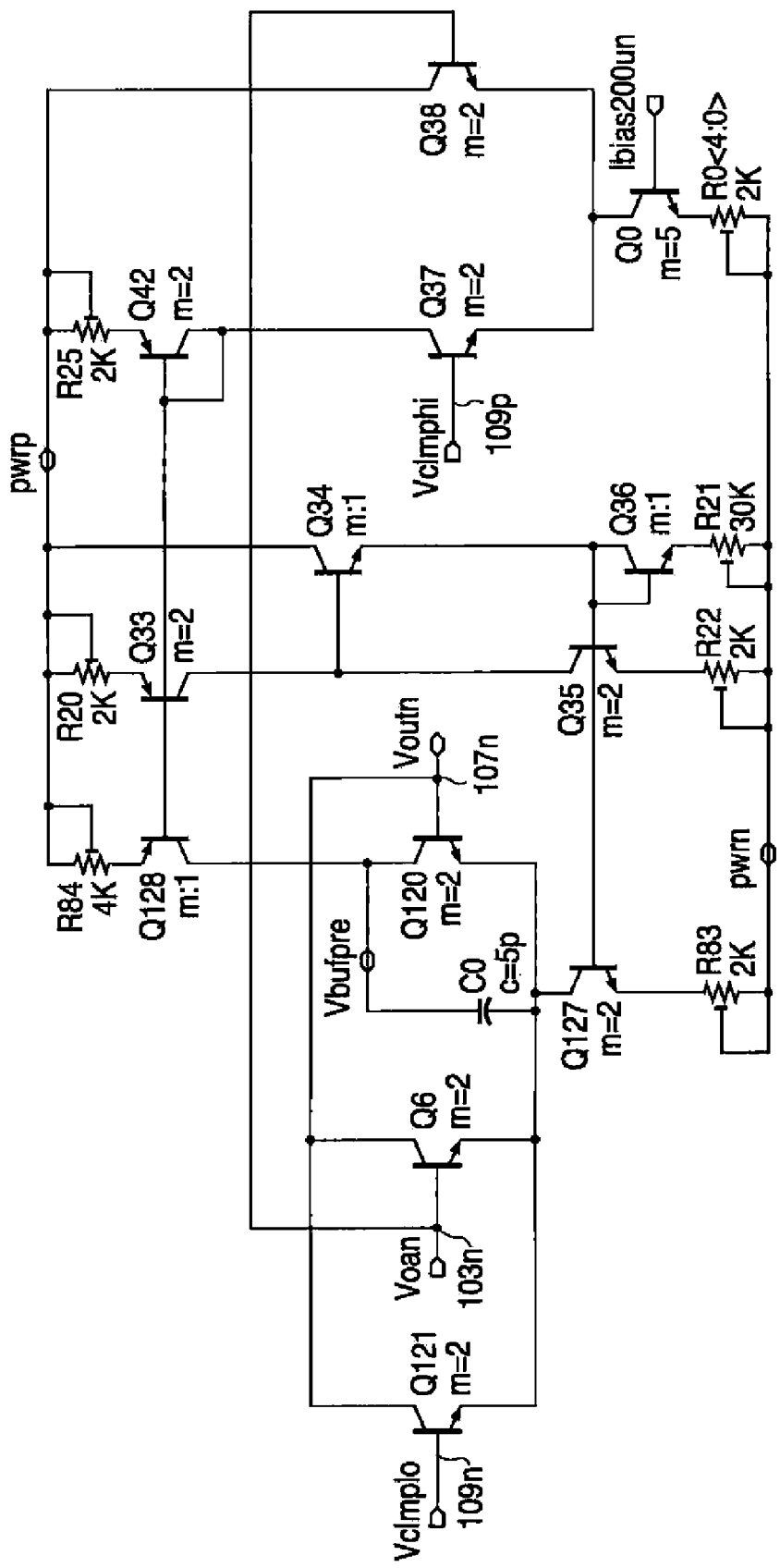

As noted above, the output voltages Voutp, Voutn provided by the voltage comparators 106p, 106n are provided during substantially mutually exclusive time intervals as the final output voltage Vout. With reference to FIGS. 3 and 4, this is achieved as follows. As discussed above, when the upper amplified voltage Voap is greater than the higher reference voltage Vclmphi, the higher reference voltage Vclmphi is provided as the upper comparator output voltage Voutp. As also discussed above, the upper Voap and lower Voan amplified voltages are close in value. Accordingly, when the upper amplified voltage Voap is sufficiently high, its lower amplified voltage counterpart Voan also becomes greater than the higher reference voltage Vclmphi. As a result, transistor Q38 (FIG. 4) turns on, thereby diverting substantially all tail current provided by transistor Q0 from transistor Q37. This, in turn, prevents current flow through the current mirror circuitry formed by transistors Q42, Q33 and Q128, thereby causing transistor Q120 to be turned off and preventing either of the lower amplified voltage Voan or the lower reference voltage Vcmlplo to be buffered via transistors Q6 or Q121, respectively, to the output voltage Voutn. Hence, the lower voltage comparator 106n is turned off.

Similarly, when the lower amplified voltage Voan is less than the lower reference voltage Vclmplo, the lower reference voltage Vclmplo is provided as the upper comparator output voltage Voutn. Since the upper Voap and lower Voan amplified voltages are close in value, when the lower amplified voltage Voan is sufficiently low, its higher amplified voltage counterpart Voap also becomes less than the lower reference voltage Vclmplo. As a result, transistor Q79 (FIG. 3) turns on, thereby diverting substantially all tail current provided by transistor Q0 from transistor Q77. This, in turn, prevents current flow through the current mirror circuitry formed by transistors Q39, Q29 and Q123, thereby causing transistor Q122 to be turned off and preventing either of the higher amplified voltage Voap or the higher reference voltage Vcmlphi to be buffered via transistors Q7 or Q117, respectively, to the output voltage Voutp. Hence, the upper voltage comparator 106p is turned off.

Based upon the foregoing discussion, it can be seen that the actual peak voltage levels at which the output voltage Vout are determined by the substantially mutually exclusive upper Voutp and lower Voutn output voltage signals, and are substantially equal to the higher Vclmphi and lower Vclmplo reference voltages. It should also be readily understood that these reference voltages Vclmphi, Vclmplo can be controlled, e.g., programmed, by appropriate design of the reference voltage source 108 circuitry (FIG. 2C) in conjunction with externally sourced reference voltages Vclmphi, Vclmplo. For example, absent the use of externally sourced reference voltages Vclmphi, Vclmplo, the default values for the internally generated reference voltages Vclmphi, Vclmplo, in accordance with the example embodiment as depicted in FIGS. 2A, 2B and 2C, would be 1.5 volt below and above the positive PWRP and negative PWRN power supply voltages, respectively (i.e., Vclmphi=PWRP−1.5 and Vclmplo=PWRN+1.5). Alternatively, with the use of externally sourced reference voltages Vclmphi, Vclmplo, if it was desired to have the higher and lower peak values of the output signal 107 limited to three and two volts, respectively, for example, then externally sourced reference voltages of three and two volts would be applied to the Vclmphi and Vclmplo electrodes, respectively.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a voltage limiter, comprising:
    at least one input electrode to convey an input signal having a magnitude;
    a plurality of reference electrodes to convey lower and higher reference voltages;
    an output electrode to convey an output voltage signal having a magnitude with minimum and maximum values corresponding to lower and higher clamp voltages, respectively;
    amplifier circuitry coupled to said at least one input electrode and including one or more signal electrodes, and responsive to said input signal and said lower and higher clamp voltages by providing, via said one or more signal electrodes, one or more voltage signals having respective magnitudes corresponding to said input signal magnitude;
    signal clamp circuitry coupled to said plurality of reference electrodes and said one or more signal electrodes, and responsive to said lower and higher reference voltages by providing said lower and higher clamp voltages; and
    comparator circuitry coupled to said plurality of reference electrodes, said signal clamp circuitry, said one or more signal electrodes and said output electrode, and responsive to said lower and higher reference voltages, said lower and higher clamp voltages, and said one or more voltage signals by providing said output voltage signal, wherein said output voltage signal magnitude
        corresponds to said one or more voltage signal magnitudes when at least one of said one or more voltage signal magnitudes is greater than said lower reference voltage and less than said higher reference voltage,
        corresponds to said lower reference voltage when at least one of said one or more voltage signal magnitudes is less than said lower reference voltage, and
        corresponds to said higher reference voltage when at least one of said one or more voltage signal magnitudes is greater than said higher reference voltage.

2. The apparatus of claim 1, wherein said minimum and maximum values of said output voltage signal magnitude are substantially equal to said lower and higher clamp voltages, respectively.

3. The apparatus of claim 1, wherein said lower and higher clamp voltages are substantially equal to said lower and higher reference voltages, respectively.

4. The apparatus of claim 3, wherein said minimum and maximum values of said output voltage signal magnitude are substantially equal to said lower and higher clamp voltages, respectively.

5. The apparatus of claim 1, wherein said output voltage signal magnitude is:
    substantially equal to said one or more voltage signal magnitudes when at least one of said one or more voltage signal magnitudes is greater than said lower reference voltage and less than said higher reference voltage,
    substantially equal to said lower reference voltage when at least one of said one or more voltage signal magnitudes is less than said lower reference voltage, and
    substantially equal to said higher reference voltage when at least one of said one or more voltage signal magnitudes is greater than said higher reference voltage.

6. The apparatus of claim 1, wherein said signal clamp circuitry is responsive to said lower and higher reference voltages and to said one or more voltage signals by providing said lower and higher clamp voltages during substantially mutually exclusive time intervals.

7. The apparatus of claim 1, wherein:
    said at least one input electrode comprises first and second input electrodes;
    said input signal comprises a differential input signal; and
    said amplifier circuit comprises a differential amplifier circuit.

8. The apparatus of claim 1, wherein said signal clamp circuit comprises
- a first voltage clamp circuit coupled between one of said plurality of reference electrodes and one of said one or more signal electrodes, and including a plurality of diode-connected transistors; and
- a second voltage clamp circuit coupled between another of said plurality of reference electrodes and another of said one or more signal electrodes, and including another plurality of diode-connected transistors.

9. The apparatus of claim 1, wherein said comparator circuitry comprises first and second comparator circuits.

10. The apparatus of claim 9, wherein:
- said first and second comparator circuits together provide said output voltage signal when said at least one of said one or more voltage signal magnitudes is greater than said lower reference voltage and less than said higher reference voltage;
- said first comparator circuit provides said output voltage signal when said at least one of said one or more voltage signal magnitudes is less than said lower reference voltage; and
- said second comparator circuit provides said output voltage signal when said at least one of said one or more voltage signal magnitudes is greater than said higher reference voltage.

11. The apparatus of claim 9, wherein:
- said first and second comparator circuits are both active when said at least one of said one or more voltage signal magnitudes is greater than said lower reference voltage and less than said higher reference voltage;
- said first comparator circuit is active and said second comparator circuit is substantially inactive when said at least one of said one or more voltage signal magnitudes is less than said lower reference voltage; and
- said second comparator circuit is active and said first comparator circuit is substantially inactive when said at least one of said one or more voltage signal magnitudes is greater than said higher reference voltage.

12. The apparatus of claim 9, wherein said first comparator circuit comprises signal comparison circuit responsive to said lower reference voltage, said lower and higher clamp voltages, and said at least one of said one or more voltage signals by providing said output voltage signal, and wherein said output voltage signal magnitude:
- corresponds to said at least one of said one or more voltage signal magnitudes when said at least one of said one or more voltage signal magnitudes is greater than said lower reference voltage and less than said higher reference voltage;
- corresponds to said lower reference voltage when said at least one of said one or more voltage signal magnitudes is less than said lower reference voltage; and
- corresponds to said higher reference voltage when said at least one of said one or more voltage signal magnitudes is greater than said higher reference voltage.

13. The apparatus of claim 9, wherein said second comparator circuit comprises signal comparison circuit responsive to said lower reference voltage, said lower and higher clamp voltages, and said at least one of said one or more voltage signals by providing said output voltage signal, and wherein said output voltage signal magnitude:
- corresponds to said at least one of said one or more voltage signal magnitudes when said at least one of said one or more voltage signal magnitudes is greater than said lower reference voltage and less than said higher reference voltage;
- corresponds to said lower reference voltage when said at least one of said one or more voltage signal magnitudes is less than said lower reference voltage; and
- corresponds to said higher reference voltage when said at least one of said one or more voltage signal magnitudes is greater than said higher reference voltage.

14. An apparatus including a voltage limiter, comprising:
- amplifier means for receiving an input signal having a magnitude, and lower and higher clamp voltages and in response thereto providing one or more voltage signals having respective magnitudes corresponding to said input signal magnitude;
- signal clamping means for receiving lower and higher reference voltages and in response thereto providing said lower and higher clamp voltages; and
- comparator means for receiving said lower and higher reference voltages, said lower and higher clamp voltages, and said one or more voltage signals and in response thereto providing said output voltage signal, wherein said output voltage signal magnitude
  - has a magnitude with minimum and maximum values corresponding to lower and higher clamp voltages, respectively,
  - corresponds to said one or more voltage signal magnitudes when at least one of said one or more voltage signal magnitudes is greater than said lower reference voltage and less than said higher reference voltage,
  - corresponds to said lower reference voltage when at least one of said one or more voltage signal magnitudes is less than said lower reference voltage, and
  - corresponds to said higher reference voltage when at least one of said one or more voltage signal magnitudes is greater than said higher reference voltage.

15. The apparatus of claim 14, wherein said minimum and maximum values of said output voltage signal magnitude are substantially equal to said lower and higher clamp voltages, respectively.

16. The apparatus of claim 14, wherein said lower and higher clamp voltages are substantially equal to said lower and higher reference voltages, respectively.

17. The apparatus of claim 16, wherein said minimum and maximum values of said output voltage signal magnitude are substantially equal to said lower and higher clamp voltages, respectively.

18. The apparatus of claim 14, wherein said output voltage signal magnitude is:
- substantially equal to said one or more voltage signal magnitudes when at least one of said one or more voltage signal magnitudes is greater than said lower reference voltage and less than said higher reference voltage,
- substantially equal to said lower reference voltage when at least one of said one or more voltage signal magnitudes is less than said lower reference voltage, and
- substantially equal to said higher reference voltage when at least one of said one or more voltage signal magnitudes is greater than said higher reference voltage.

19. The apparatus of claim 14, wherein said signal clamping means is for receiving said lower and higher reference voltages and said one or more voltage signals and in response thereto providing said lower and higher clamp voltages during substantially mutually exclusive time intervals.

20. A method for limiting a signal voltage, comprising:
- receiving an input signal having a magnitude, and lower and higher clamp voltages and in response thereto providing one or more voltage signals having respective magnitudes corresponding to said input signal magnitude;

receiving lower and higher reference voltages and in response thereto providing said lower and higher clamp voltages; and comparing said lower and higher reference voltages, said lower and higher clamp voltages, and said one or more voltage signals and in response thereto providing said output voltage signal, wherein said output voltage signal magnitude has a magnitude with minimum and maximum values corresponding to lower and higher clamp voltages, respectively, corresponds to said one or more voltage signal magnitudes when at least one of said one or more voltage signal magnitudes is greater than said lower reference voltage and less than said higher reference voltage, corresponds to said lower reference voltage when at least one of said one or more voltage signal magnitudes is less than said lower reference voltage, and corresponds to said higher reference voltage when at least one of said one or more voltage signal magnitudes is greater than said higher reference voltage.

* * * * *